(12) United States Patent
Xiang et al.

(10) Patent No.: US 10,497,783 B2
(45) Date of Patent: Dec. 3, 2019

(54) SEMICONDUCTOR STRUCTURE AND METHOD OF PREPARING SEMICONDUCTOR STRUCTURE

(71) Applicant: ENKRIS SEMICONDUCTOR, INC, Jiangsu (CN)

(72) Inventors: Peng Xiang, Jiangsu (CN); Kai Cheng, Jiangsu (CN)

(73) Assignee: ENKRIS SEMICONDUCTOR, INC, Jiangsu (CN)

( * ) Notice: Subject to any disclaimer, the term of this patent is extended or adjusted under 35 U.S.C. 154(b) by 0 days.

(21) Appl. No.: 16/099,170

(22) PCT Filed: Apr. 24, 2017

(86) PCT No.: PCT/CN2017/081657
§ 371 (c)(1),
(2) Date: Nov. 5, 2018

(87) PCT Pub. No.: WO2018/195702
PCT Pub. Date: Nov. 1, 2018

(65) Prior Publication Data
US 2019/0157394 A1 May 23, 2019

(51) Int. Cl.
*H01L 29/15* (2006.01)
*H01L 21/768* (2006.01)
*H01L 21/02* (2006.01)

(52) U.S. Cl.
CPC ...... *H01L 29/155* (2013.01); *H01L 21/02458* (2013.01); *H01L 21/02507* (2013.01);
(Continued)

(58) Field of Classification Search
CPC .................................................. H01L 21/0245
See application file for complete search history.

(56) References Cited

U.S. PATENT DOCUMENTS

2005/0282330 A1* 12/2005 Mears ................. B82Y 10/00
438/222
2009/0278233 A1* 11/2009 Pinnington ....... H01L 21/02389
257/615
(Continued)

FOREIGN PATENT DOCUMENTS

CN 103296161 A 9/2013
CN 104518019 A 4/2015
(Continued)

OTHER PUBLICATIONS

ISA/CN, International Search Report dated Jan. 29, 2018 in International Application No. PCT/CN2017/081657, total 4 pages with English translation.

*Primary Examiner* — Thao P Le
(74) *Attorney, Agent, or Firm* — Masuvalley & Partners

(57) ABSTRACT

The invention provides a semiconductor structure and a method of preparing a semiconductor structure, which solves the problems of easy cracking, large warpage and large dislocation density which exist in a semiconductor compound epitaxial structure epitaxially grown on a substrate in the prior art. The semiconductor structure includes: a substrate; at least one periodic structure disposed over the substrate; wherein each of the periodic structures includes at least one period, each period including a first periodic layer and a second periodic layer which are sequentially stacked in an epitaxial direction.

15 Claims, 2 Drawing Sheets

(52) U.S. Cl.
CPC .... *H01L 21/76871* (2013.01); *H01L 21/0245* (2013.01); *H01L 21/02477* (2013.01); *H01L 2924/3511* (2013.01); *H01L 2924/3512* (2013.01)

(56) References Cited

U.S. PATENT DOCUMENTS

| | | | |
|---|---|---|---|
| 2013/0043488 A1* | 2/2013 | Miyoshi | C30B 25/183 257/76 |
| 2013/0092953 A1* | 4/2013 | Miyoshi | H01L 21/02381 257/76 |
| 2017/0279003 A1* | 9/2017 | Ishibashi | H01L 33/007 |

FOREIGN PATENT DOCUMENTS

| | | |
|---|---|---|
| CN | 104733548 A | 6/2015 |
| CN | 105580146 A | 5/2016 |

\* cited by examiner

X-base: wafer distance(mm), Y-base: surface height(um)

SEMICONDUCTOR STRUCTURE AND METHOD OF PREPARING SEMICONDUCTOR STRUCTURE

RELATED APPLICATIONS

This application is a U.S. National Phase application under 35 U.S.C. § 371 of International Patent Application No. PCT/CN2017/081657 filed on Apr. 24, 2017, which is hereby expressly incorporated by reference in its entirety for all purposes.

TECHNICAL FIELD

The present invention relates to semiconductor technology, and more particularly to a semiconductor structure and a method of preparing a semiconductor structure.

BACKGROUND OF THE DISCLOSURE

Semiconductor compounds are widely used in the preparation of various light-emitting elements and electronic components because of their excellent semiconductor properties. A component action layer prepared using a semiconductor compound is generally formed by epitaxial growth on a substrate. However, the substrate and the epitaxially grown semiconductor compound may have different coefficients of thermal expansion and lattice constant, thereby causing a great thermal mismatch and lattice mismatch between the substrate and the epitaxially grown structure. Thus, when the semiconductor compound structure is epitaxially grown on the substrate, a large tensile strain may be generated in the process of cooling from a high temperature, so that the epitaxially grown structure may have problems of easy cracking, large warpage, and large dislocation density.

SUMMARY OF THE INVENTION

In view of the above, the present invention provides a semiconductor structure and a method of preparing a semiconductor structure, which solves the problems of easy cracking, warpage, and dislocation density which exist in a semiconductor compound epitaxial structure epitaxially grown on a substrate in the prior art.

A semiconductor structure according to an embodiment of the invention includes:
 a substrate;
 at least a periodic structure disposed above said substrate;
 wherein the materials of said periodic structures are semiconductor compounds, each said periodic structure includes at least one period, each said period includes a first periodic layer and a second periodic layer which are sequentially stacked in an epitaxial direction;
 wherein said first periodic layer includes a first element and a second element, said second periodic layer includes said first element and said second element; or, said first periodic layer includes said first element, said second element and a third element, said second periodic layer includes said first element, said second element, and said third element; or, said first periodic layer includes said first element and said third element, said second periodic layer includes said first element, said second element, and said third element; wherein the atomic number of said first element is smaller than the atomic number of said second element;
 wherein, in the same periodic structure, said first element of said first periodic layer has a percentage of the number of atoms in compound composition greater than a percentage of the number of atoms in compound composition of said first element of said second periodic layer, the thickness of the nth periodic structure is smaller than the thickness of the (n+1)th periodic structure, wherein n is an integer greater than or equal to 1.

Wherein, the number of periods of said nth periodic structure is less than the number of periods of said (n+1)th periodic structure.

Wherein, the materials of said first periodic layer and said second periodic layer are both IV-IV group binary compounds, said first element and said second element are two types of IV group elements, respectively.

Wherein, said first element and said second element are Si and Ge, respectively.

Wherein, the materials of said first periodic layer and said second periodic layer are both IV-IV group compounds, said first element, said second element, and said third element are three types of IV group elements, respectively; or the materials of said first periodic layer and said second periodic layer are both III-V group compounds, said first element and said second element are two types of III group elements respectively, and said third element is a V group element; or the materials of said first periodic layer and said second periodic layer are both II-VI group compounds, said first element and said second element are two types of II group elements respectively, and said third element is a VI group element.

Wherein, the materials of said first periodic layer and said second periodic layer are both IV-IV group compounds, said first element, said second element, and said third element are Si, Ge and Sn, respectively; or the materials of said first periodic layer and said second periodic layer are both III-V group compounds, said first element and said second element are Al and Ga respectively, and said third element is N; or the materials of said first periodic layer and said second periodic layer are both II-VI group compounds, said first element and said second element are Zn and Cd respectively, and said third element is Se.

Wherein, in the same periodic structure, the thickness of said second periodic layer is greater than the thickness of said first periodic layer.

Wherein, in said at least one periodic structure, the thickness of said first periodic layer of said nth periodic structure in the epitaxial direction is greater than the thickness of said first periodic layer of said (n+1)th periodic structure, the thickness of said second periodic layer of said nth periodic structure is equal to the thickness of said second periodic layer of said (n+1)th periodic structure; or in said at least one periodic structure, the thickness of said second periodic layer of said nth periodic structure in the epitaxial direction is smaller than the thickness of said second periodic layer of said (n+1)th periodic structure, and the thickness of said first periodic layer of said nth periodic structure is equal to the thickness of said first periodic layer of said (n+1)th periodic structure; or in said at least one periodic structure, the thickness of said first periodic layer of said nth periodic structure in the epitaxial direction is greater than the thickness of said first periodic layer of said (n+1)th periodic structure, and the thickness of said second periodic layer of said nth periodic structure is less than the thickness of said second periodic layer of said (n+1)th periodic structure.

Wherein, the semiconductor structure includes three periodic structures, a first periodic structure includes 40 periods, a second periodic structure includes 50 periods, and a third periodic structure includes 60 periods;

in the three periodic structures, the thickness of the first periodic layer is 3 nm~10 nm, the thickness of the first periodic layer of the nth periodic structure is greater than the thickness of the first periodic layer of the (n+1)th periodic structure by 2 nm~3 nm; and/or, the thickness of the second periodic layer in the three periodic structures is 10 nm~30 nm, the thickness of the second periodic layer of the nth periodic structure is smaller than the thickness of the second periodic layer of the (n+1)th periodic structure by 0 nm~10 nm.

Wherein, the semiconductor structure includes five periodic structures, a first periodic structure includes 10 periods, a second periodic structure includes 20 periods, and a third periodic structure includes 30 periods, a fourth periodic structure includes 40 periods, and a fifth structure includes 45 periods;

the thickness of the first periodic layer in the five periodic structures is the same, i.e., 5 nm~10 nm; and/or, the thickness of the second periodic layer in the five periodic structures is 10 nm~25 nm, the thickness of the second periodic layer of the nth periodic structure is smaller than the thickness of the second periodic layer of the (n+1)th periodic structure by 0 nm~5 nm.

Wherein, in said at least one periodic structure, said first element of said second periodic layer of said nth periodic structure in the epitaxial direction has a percentage $x_n$ of the number of atoms in compound composition greater than the percentage $x_{n+1}$ of the number of atoms in compound composition of said first element of said second periodic layer of said (n+1)th periodic structure, and said first element of said first periodic layer of said nth periodic structure has a percentage $y_n$ of the number of atoms in compound composition greater than or equal to the percentage $y_{n+1}$ of the number of atoms in compound composition of said first element of said first periodic layer of said (n+1)th periodic structure.

Wherein, the semiconductor structure includes 5 periodic structures, a first periodic structure includes 10 periods, a second periodic structure includes 20 periods, a third periodic structure includes 30 periods, a fourth periodic structure includes 40 periods, and the fifth periodic structure includes 45 periods.

Wherein, the first element of the first periodic layer of the five periodic structures has a same percentage of the number of atoms in compound composition is 0.8~1; and/or, the first element of the second periodic layer of the five periodic structures has a percentage of the number of atoms in compound composition is 0.2~0.6, the first element of the second periodic layer of the nth periodic structure has a percentage a percentage $x_n$ of the number of atoms in compound composition greater than the percentage $x_{n+1}$ of the number of atoms in compound composition of the first element of the second periodic layer of the (n+1)th periodic structure by 0.1;

wherein, the first element is Al, the second element is Ga, and the third element is N.

Wherein, the at least a periodic structure is sequentially stacked in an epitaxial direction.

Wherein, the semiconductor structure further includes: a nucleation layer disposed between said substrate and the first one of said periodic structures.

Wherein, said nucleation layer includes one or more of AlN, AlGaN.

Wherein, the semiconductor structure further includes: a component active layer disposed over said at least one periodic structure.

Wherein, said component active layer includes one or more of GaN, AlGaN, AlInGaN.

Wherein, said substrate includes one or more of Si, SiC, GaN, $Al_2O_3$.

An embodiment of the present invention provides a method of preparing a semiconductor structure, including:

preparing at least one periodic structure over a substrate; wherein the materials of said periodic structures are semiconductor compounds, each said periodic structure includes at least one period, each said period includes a first periodic layer and a second periodic layer which are sequentially stacked in an epitaxial direction; wherein said first periodic layer includes a first element and a second element, said second periodic layer includes said first element and said second element; or, said first periodic layer includes said first element, said second element and a third element, said second periodic layer includes said first element, said second element and said third element; or, the first periodic layer includes said first element and said third element, said second periodic layer includes said first element, said second element and said third element; wherein the atomic number of said first element is smaller than the atomic number of said second element; wherein, in the same periodic structure, said first element of said first periodic layer has a percentage of the number of atoms in compound composition greater than the percentage of the number of atoms in compound composition of said first element of said second periodic layer, the thickness of the nth periodic structure is smaller than the thickness of the (n+1)th periodic structure, wherein n is an integer greater than or equal to 1.

As for the semiconductor structures prepared by above mentioned methods, at least a periodic structure above the substrate forms an epitaxial structure, all the periodic layers in the periodic structure use semiconductor compounds. Since the atomic number of the first element is smaller than the atomic number of the second element, and in the same periodic structure, the first element of the first periodic layer has a percentage of the number of atoms in compound composition larger than the percentage of the number of atoms in compound composition for the first element of the second periodic layer, therefore in each period of the same periodic structure, the second periodic layer located above will be subjected to a pressing stress, acting as protruding the center towards the periphery, from the first periodic layer beneath, the pressing stress can effectively balance out a tensile stress, acting as concaving the periphery towards the center in the entire epitaxial structure during a cooling process, such that the entire epitaxial structure will not easily get cracked and warped.

Meanwhile, since the dislocation density of a position in the epitaxial structure closer to the substrate is larger, and the position with large dislocation density easily cause the release of the pressing stress, and the released pressing stress will not take effect to balance out the tensile stress, a periodic structure with a lower dislocation density may therefore have a larger thickness by setting the thickness of the nth periodic structure along the epitaxial direction smaller than the thickness of the (n+1)th periodic structure, such that the pressing stress introduced in a periodic structure far away from the substrate can better balance out a tensile stress, thereby effectively balance the release of the pressing stress in the entire epitaxial structure, ensuring an equilibrium effect of the pressing stress against the tensile stress in the entire epitaxial structure.

BRIEF DESCRIPTION OF THE DRAWINGS

The present disclosure is described in conjunction with the appended figures.

DETAILED DESCRIPTION OF THE INVENTION

In order to better understand the objects, technical means and advantages of the present invention, the present invention will be further described in detail below with reference to the accompanying drawings.

Embodiment 1

Figure 1:
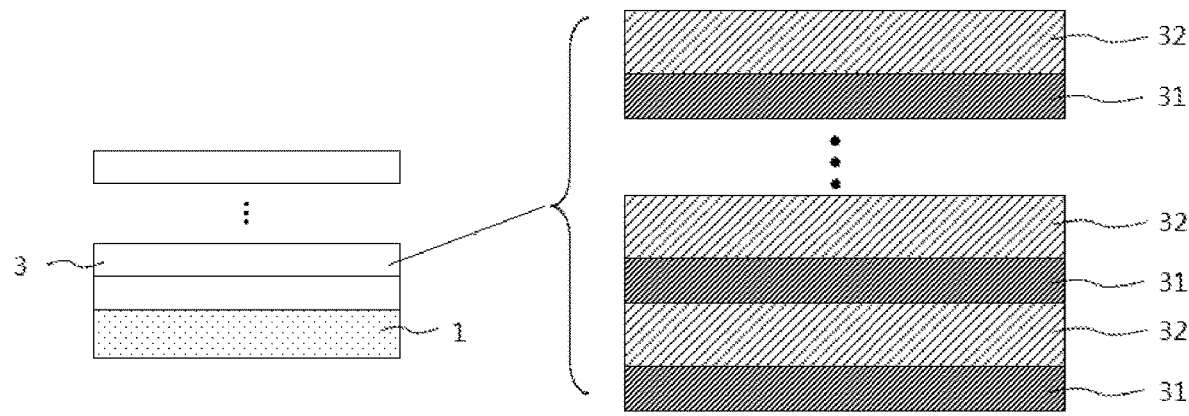
FIG. 1 is a schematic diagram of a semiconductor structure according to an embodiment of the invention.

FIG. 1 is a schematic diagram of a semiconductor structure according to an embodiment of the invention. As shown in FIG. 1, the semiconductor structure includes a substrate 1, and at least one periodic structure 3 disposed above the substrate 1. Each of the periodic structures 3 includes at least one period, and each period includes a first periodic layer 31 and a second periodic layer 32 which are sequentially superposed in the epitaxial direction.

Figure 2:
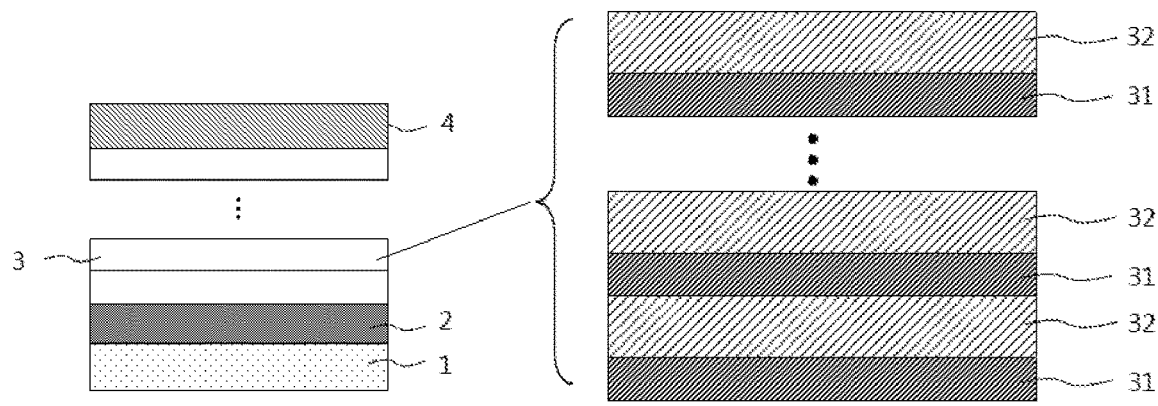
FIG. 2 is a schematic diagram of a semiconductor structure according to another embodiment of the present invention.

In an embodiment of the present invention, as shown in FIG. 2, in order to reduce the dislocation density and the defect density and prevent melt-back, the semiconductor structure may further include a nucleation layer 2 disposed between the substrate 1 and the first periodic structure 3. In another embodiment of the invention, in order to form a complete structure for an electronic component, the semiconductor structure may further include a component action layer 4 disposed over the at least one periodic structure 3. The active regions may be continuously stacked on the component action layer 4, and the active regions may be selected from a light-emitting diode formed by an indium gallium nitride/gallium nitride multi-quantum well structure and a p-type nitride, a high electron mobility transistor formed by an aluminum gallium nitride/gallium nitride heterostructure, a high mobility transistor formed by an aluminum gallium indium nitride/gallium nitride heterostructure, a high mobility triode formed by an aluminum nitride/gallium nitride heterostructure, a gallium nitride MOSFET, a UV-LED, a photodetector, a hydrogen generator or solar battery.

In an embodiment of the invention, the nucleation layer 2 may include one or more of AlN and AlGaN. The component action layer 4 may include one or more of GaN, AlGaN, and AlInGaN. The substrate 1 may include one or more of Si, SiC, GaN, and $Al_2O_3$. However, the materials for the nucleation layer 2, the component action layer 4, and the substrate 1 can be adjusted according to requirements of actual applications, which are not limited by the present invention.

The materials of the periodic layers in the periodic structure 3 are semiconductor compounds. Specifically, a first periodic layer 31 includes a first element and a second element, and a second periodic layer 32 includes the first element and the second element; or, the first periodic layer 31 includes the first element, the second element, and the third element, the second periodic layer 32 includes the first element, the second element, and the third element; or, the first periodic layer 31 includes the first element and the third element, and the second periodic layer 32 includes the first element, the second element, and the third element; wherein the atomic number of the first element is less than the atomic number of the second element. In the same periodic structure, the percentage of the number of atoms in compound composition for the first element of the first periodic layer 31 is greater than the percentage of the number of atoms in compound composition for the first element of the second periodic layer. The thickness of the nth periodic structure 3 is smaller than the thickness of the (n+1)th periodic structure 3, wherein n is an integer greater than or equal to 1.

In an embodiment of the present invention, the number of periods of the nth periodic structure 3 is smaller than the number of periods of the (n+1)th periodic structure 3, so that the thickness of the nth periodic structure 3 is smaller than the thickness of the (n+1)th periodic structure 3. By setting the number of periods to achieve the thickness adjustment for the adjacent two periodic structures 3, the process may be simply achieved.

As may be seen, in the semiconductor structure provided by the embodiment of the present invention, at least one periodic structure 3 above the substrate constitutes an epitaxial structure, and the periodic layers in the periodic structure 3 all use semiconductor compounds. Since the atomic number of the first element is smaller than the atomic number of the second element, and in the same periodic structure 3, the first element of the first periodic layer 31 has a larger percentage of the number of atoms in compound composition than the percentage of the number of atoms in compound composition for the first element of the second periodic layer 32, thus, in each period of the same periodic structure 3, the second periodic layer 32 located above will be subjected to a pressing stress, acting as protruding the center towards the periphery, from the first periodic layer 31 located below, and the pressing stress can effectively balance out a tensile stress, acting as concaving the periphery towards the center in the entire epitaxial structure during a cooling process, such that the entire epitaxial structure will not easily get cracked and warped.

Meanwhile, due to the closer to the substrate in the epitaxial structure, the greater the dislocation density, and the position where the dislocation density is larger tends to cause the release of the pressing stress, and the released pressing stress will not take effect to balance out the tensile stress, a periodic structure 3 with a lower dislocation density may therefore have a larger thickness by setting the thickness of the nth periodic structure 3 along the epitaxial direction smaller than the thickness of the (n+1)th periodic structure 3, such that the pressing stress introduced in a periodic structure 3 far away from the substrate can better balance out a tensile stress, thereby effectively balance the release of the pressing stress in the entire epitaxial structure, ensuring an equilibrium effect of the pressing stress against the tensile stress in the entire epitaxial structure.

In an embodiment of the present invention, the material of the periodic layers in the periodic structure 3 may specifically use an III-V group compound, and the first element and the second element may be two types of III group elements, and the third element may be a V group element. Specifically, the first periodic layer 31 may include two III group elements (hereinafter denoted by $III^1$ and $III^2$, respectively) and one V group element (hereinafter denoted by $V^1$), and the second periodic layer 32 may include $III^1$, $III^2$, and $V^1$; or, the first periodic layer 31 may include $III^1$ and $V^1$, and the second periodic layer 32 may include $III^1$, $III^2$, and $V^1$.

Taking $III^1$ as Al, $III^2$ as Ga, and $V^1$ as N as an example, the material of the first periodic layer 31 can be represented as $Al_yGa_{1-y}N$, and the material of the second periodic layer 32 can be represented as $Al_xGa_{1-x}N$, $1≥y>x>0$. Since in the III-V group compound, the III-V group compound is formed by the III group element and the V group element at a certain atomic ratio (the total number of atoms of III group element: the total number of atoms of V group element=1:1), when the percentage of atoms of one of the III group elements in compound composition decreases, the percentage of the number of atoms of the other III group elements in compound composition increases. Since the atomic number of Ga is larger than the atomic number of Al, when the percentage of the number of atoms of Al in the second periodic layer 32 gets lower with respect to that of the first periodic layer 31 in the same period, the percentage of the number of atoms for Ga in compound composition will increase, such that the second periodic layer 32 located above will be subjected to a pressing stress protruding the center to the periphery, from the first periodic layer 31 located below.

Figure 3A:
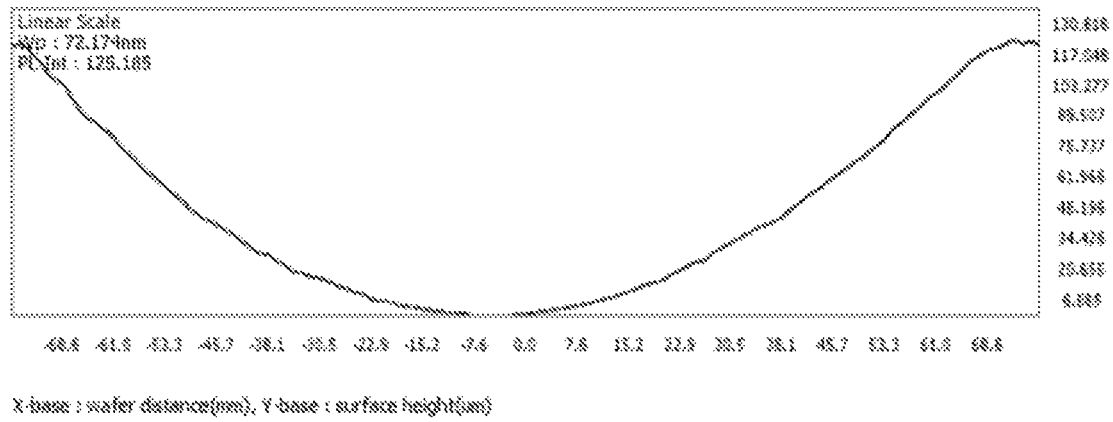
FIGS. 3A-3B are schematic diagrams showing experimental comparison results for stress control capability according to an embodiment of the present invention.
Figure 3B:
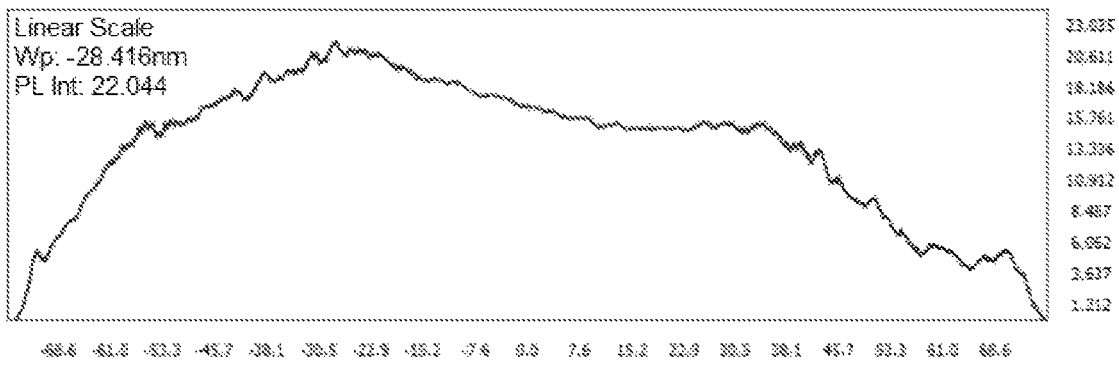

In order to verify the capability of the semiconductor structure to regulate the tensile stress according to the embodiments of the present invention, the following comparative tests are carried out: Sample A uses an epitaxial layer structure prepared from semiconductor material having a constant compound composition, and Sample B uses an epitaxial layer structure provided by the embodiments of the present invention. The warped shape of Sample A is shown in FIG. 3A, the warped shape of Sample B is shown in FIG. 3B, and the horizontal axis of these figures is the position coordinate (in millimeters) of the sample, and the vertical axis is the height (in micrometers) of the surface of the sample at this position. As shown in FIG. 3A, the warped shape of Sample A is concave, and its center is about 120 μm lower than its edge due to a tensile stress created during the cooling process, and cracks exist on the surface of the epitaxial structure. As shown in FIG. 3B, the warped shape of Sample B is slightly convex, and the center is about 20 micrometers higher than the edge, and as may be seen, with the epitaxial structure of the present invention, the pressing stress during the growth process has already balanced the tensile stress created during the cooling process, and the surface of the epitaxial structure is free of cracks.

It should be understood that although in the above description of the embodiments, the first element and the second element in the semiconductor compound constituting the periodic structure 3 are defined as III group elements, and the third element is defined as a V group element, the periodic structure 3 may specifically select other semiconductor compounds other than the III-V group compound, and the specific composition of the semiconductor compound of the present invention is not limited. It should also be understood that although the III group element is defined as Al or Ga in the description of the above embodiments, and the V group element is defined as N, other III group elements and V group elements may also be included in the periodic structure 3, the specific selection for the III group element and the V group element in the present invention is not limited. Meanwhile, the material of the periodic layer may also use a trivalent or higher III-V group compound, and the number of the III group element and the V group element included in the periodic layer is not limited by the present invention.

In an embodiment of the invention, the materials of the first periodic layer 31 and the second periodic layer 32 may also be IV-IV group compounds, and the first element, the second element and the third element are three types of group IV elements respectively. For example, the first element, the second element, and the third element are Si, Ge, and Sn, respectively. Thus, the material of the first periodic layer 31 can be represented as $Si_yGe_{1-y}Sn$, and the material of the second periodic layer 32 can be represented as $Si_xGe_{1-x}Sn$, $1≥y>x>0$. The present invention does not limit the specific selected type and number of the group IV elements included in the ternary IV-IV compound.

In an embodiment of the present invention, the materials of the first periodic layer 31 and the second periodic layer 32 may also be II-VI group compounds, the first element and the second element are two types of II group elements respectively, and the third element is a VI group element. For example, the materials of the first periodic layer 31 and the second periodic layer 32 are both ternary II-VI compounds, the first and second elements are Zn and Cd respectively, and the third element is Se. Thus, the material of the first periodic layer 31 can be represented as $Zn_yCd_{1-y}Se$, and the material of the second periodic layer 32 can be represented as $Zn_xCd_{1-x}Se$, $1≥y>x>0$. However, the specific selected type and number of the group II and group IV elements included in the ternary II-VI compound of the present invention are not limited.

In an embodiment of the invention, the materials of the first periodic layer 31 and the second periodic layer 32 may also be binary IV-IV group compounds, and the first element and the second element are two types of group IV elements, respectively. For example, the first element and the second element are Si and Ge, respectively. Thus, the material of the first periodic layer 31 can be represented as $Si_yGe_{1-y}$, and the material of the second periodic layer 32 can be represented as $Si_xGe_{1-x}$, $1≥y>x>0$. However, the specific selection and number of the IV group element included in the binary IV-IV compound of the present invention are not limited.

However, in order to better understand the technical solution of the present invention, the technical solution of the present invention will be further described by taking the first periodic layer 31 as $Al_yGa_{1-y}N$ and the second periodic layer 32 as $Al_xGa_{1-x}N$ as an example. In the description of the subsequent embodiments of the present invention, $III^1$ and Al, $III^2$ and Ga, and $V^1$ and N will not be differentiated.

In an embodiment of the invention, as shown in FIG. 1, the at least one periodic structure 3 is sequentially stacked in the epitaxial direction of the substrate 1. However, it should be understood that the at least one periodic structure 3 may not be sequentially stacked, but be interposed with other semiconductor structures (for example, at least one III-V group compound layer in which the percentage of number of atoms of Al in compound composition becomes smaller in the epitaxial direction and then becomes larger, and the thickness of the smaller portion is larger than the thickness of the larger portion to form a periodically varying stress field so as to further reduce the dislocation density in the epitaxial structure and further introduce pressing stress), and the present invention does not limit the arranged structure for the periodic structure 3 above the substrate 1. In addition, the specific number of the at least one periodic structure 3 can also be adjusted according to the needs of actual applications, and the number of the periodic structures 3 located above the substrate 1 is also not limited by the present invention.

In an embodiment of the invention, the thickness $T_2$ of the second periodic layer 32 may also be greater than the thickness $T_1$ of the first periodic layer 31 in the same periodic structure 3. Therefore, in one periodic structure 3, the thickness of the first periodic layer 31 having a greater percentage of the number of atoms of Al is smaller than the thickness of the second periodic layer 32 having a lower percentage of the number of atoms of Al, which may further reduce the release of pressing stress, reduce dislocation density throughout the epitaxial structure, and improve material and device performance.

Embodiment 2

The first embodiment described above introduces a pressing stress into each periodic structure 3, in order to further introduce the pressing stress between two adjacent periodic structures 3 and increase the thickness of periodic structure 3 along the epitaxial direction by increasing the number of periods along the epitaxial direction, the thickness of the adjacent periodic structures 3 can be independently adjusted, and the default arrangement is that compound composition in each periodic structure 3 is the same. Specifically, in at least one periodic structure 3, the thickness of the first periodic layer 31 of the nth periodic structure 3 in the epitaxial direction may be greater than the thickness of the first periodic layer 31 of the (n+1)th periodic structure 3, the thickness of the second periodic layer 32 of the nth periodic structure 3 may be equal to the thickness of the second periodic layer 32 of the (n+1)th periodic structure 3; or, in at least one periodic structure 3, the thickness of the second periodic layer 32 of the nth periodic structure 3 in the epitaxial direction may be less than the thickness of the second periodic layer 32 of the (n+1)th periodic structure 3, and the thickness of the first periodic layer 31 of the nth periodic structure 3 may be equal to that of the first periodic layer 31 of the (n+1)th periodic structure 3; or, in at least one periodic structure 3, the thickness of the first periodic layer 31 of the nth periodic structure 3 in the epitaxial direction may be greater than the thickness of the first periodic layer 31 of the (n+1)th periodic structure 3, the thickness of the second periodic layer 32 of the nth periodic structure 3 may be smaller than the thickness of the second periodic layer 32 of the (n+1)th periodic structure 3. Thus, when the number of periods of the (n+1)th periodic structure 3 is larger than that of the nth periodic structure 3, the thickness of the (n+1)th periodic structure 3 is larger than the thickness of the nth periodic structure 3. Thus, in the epitaxial direction, the second periodic layer 32 having a lower percentage of the number of atoms of Al in the periodic structure 3 farther from the substrate 1 is thicker, and/or the thickness of the first periodic layer 31 having a higher percentage of the number of atoms of Al is thinner, such that the average percentage of the number of atoms of Al in the entire epitaxial structure decreases gradually along the epitaxial direction, and thereby a pressing stress is introduced into the adjacent two periodic structures 3 to balance out the tensile stress created in the cooling process.

In an embodiment of the present invention, there are three periodic structures 3 above the substrate 1:

A first periodic structure 3 is a periodic structure 3 with 40 periods, wherein $Al_{0.8}Ga_{0.2}N$ (thickness 10 nm) and $Al_{0.3}Ga_{0.7}N$ (thickness 10 nm) are sequentially stacked in one period;

A second periodic structure 3 is a periodic structure 3 with 50 periods, wherein $Al_{0.8}Ga_{0.2}N$ (thickness 10 nm) and $Al_{0.3}Ga_{0.7}N$ (thickness 20 nm) are sequentially stacked in one period;

A third periodic structure 3 is a periodic structure 3 with 60 periods in which $Al_{0.8}Ga_{0.2}N$ (thickness 10 nm) and $Al_{0.3}Ga_{0.7}N$ (thickness 30 nm) are sequentially stacked in one period.

In another embodiment of the present invention, there are three periodic structures 3 above the substrate 1:

A first periodic structure 3 is a periodic structure 3 with 40 periods, wherein $Al_{0.8}Ga_{0.2}N$ (thickness 10 nm) and $Al_{0.3}Ga_{0.7}N$ (thickness 20 nm) are sequentially stacked in one period;

A second periodic structure 3 is a periodic structure 3 with 50 periods, wherein $Al_{0.8}Ga_{0.2}N$ (thickness 7 nm) and $Al_{0.3}Ga_{0.7}N$ (thickness 20 nm) are sequentially stacked in one period;

A third periodic structure 3 is a periodic structure 3 with 60 periods in which $Al_{0.8}Ga_{0.2}N$ (thickness 4 nm) and $Al_{0.3}Ga_{0.7}N$ (thickness 20 nm) are sequentially stacked in one period.

In another embodiment of the present invention, there are three periodic structures 3 above the substrate 1:

A first periodic structure 3 is a periodic structure 3 with 40 periods, wherein $Al_{0.8}Ga_{0.2}N$ (thickness 8 nm) and $Al_{0.3}Ga_{0.7}N$ (thickness 15 nm) are sequentially stacked in one period;

A second periodic structure 3 is a periodic structure 3 with 50 periods, wherein $Al_{0.8}Ga_{0.2}N$ (thickness 5 nm) and $Al_{0.3}Ga_{0.7}N$ (thickness 20 nm) are sequentially stacked in one period;

A third periodic structure 3 is a periodic structure 3 with 60 periods in which $Al_{0.8}Ga_{0.2}N$ (thickness 3 nm) and $Al_{0.3}Ga_{0.7}N$ (thickness 25 nm) are sequentially stacked in one period.

In another embodiment of the present invention, there are three periodic structures 3 above the substrate 1:

A first periodic structure 3 is a periodic structure 3 with 40 periods, wherein AlN (thickness 5 nm) and $Al_{0.3}Ga_{0.7}N$ (thickness 10 nm) are sequentially stacked in one period;

A second periodic structure 3 is a periodic structure 3 with 50 periods, wherein AlN (thickness 5 nm) and $Al_{0.3}Ga_{0.7}N$ (thickness 20 nm) are sequentially stacked in one period;

A third periodic structure 3 is a periodic structure 3 with 60 periods in which AlN (thickness 5 nm) and $Al_{0.3}Ga_{0.7}N$ (thickness 30 nm) are sequentially stacked in one period.

In another embodiment of the present invention, there are three periodic structures 3 above the substrate 1:

A first periodic structure 3 is a periodic structure 3 with 40 periods, wherein AlN (thickness 8 nm) and $Al_{0.3}Ga_{0.7}N$ (thickness 20 nm) are sequentially stacked in one period;

A second periodic structure 3 is a periodic structure 3 with 50 periods, wherein AlN (thickness 5 nm) and $Al_{0.3}Ga_{0.7}N$ (thickness 20 nm) are sequentially stacked in one period;

A third periodic structure 3 is a periodic structure 3 with 60 periods in which AlN (thickness 3 nm) and $Al_{0.3}Ga_{0.7}N$ (thickness 20 nm) are sequentially stacked in one period.

In another embodiment of the present invention, there are three periodic structures 3 above the substrate 1:

A first periodic structure 3 is a periodic structure 3 with 40 periods, wherein AlN (thickness 8 nm) and $Al_{0.3}Ga_{0.7}N$ (thickness 15 nm) are sequentially stacked in one period;

A second periodic structure 3 is a periodic structure 3 with 50 periods, wherein AlN (thickness 5 nm) and $Al_{0.3}Ga_{0.7}N$ (thickness 20 nm) are sequentially stacked in one period;

A third periodic structure 3 is a periodic structure 3 with 60 periods in which AlN (thickness 3 nm) and $Al_{0.3}Ga_{0.7}N$ (thickness 25 nm) are sequentially stacked in one period.

It should be understood that although in the above embodiment including three periodic structures 3, the thickness of the first periodic layer 31 of the three periodic structures 3 is 3 nm~10 nm, and the thickness of the first periodic layer 31 of the nth periodic structure 3 is larger than the thickness of the first periodic layer 31 of the (n+1)th periodic structure 3 by 2 nm to 3 nm; the thickness of the second periodic layer 32 of the three periodic structures 3 is 10 nm~30 nm, and the thickness of the second periodic layer 32 of the nth periodic structure 3 is smaller than the thickness of the second periodic layer 32 of the (n+1)th periodic structure 3 by 0 nm to 10 nm (for example, 0 nm, 5 nm, and 10 nm), the specific thickness of the first periodic layer 31 and the second periodic layer 32 can be adjusted according to the needs of specific applications, and the number of periods of each periodic structure 3 can also be adjusted accordingly. For example, in another embodiment of the present invention, five periodic structures 3 are included above the substrate 1, a first periodic structure 3 may include 10 periods, and a second periodic structure 3 may include 20 periods, a third periodic structure 3 may include 30 periods, a fourth periodic structure 3 may include 40 periods, and a fifth periodic structure 3 may include 45 periods. The thickness of the first periodic layer 31 in the five periodic structures 3 is equal to 5 nm~10 nm; the thickness of the second periodic layer 32 in the five periodic structures 3 is 10 nm~25 nm, and the thickness of the second periodic layer 32 of the nth periodic structure 3 is smaller than the thickness of the second periodic layer 32 of the (n+1)th periodic structure 3 by 0 nm to 5 nm. However, the present invention does not specifically limit the specific thickness of the first periodic layer 31 and the second periodic layer 32 and the number of periods for each periodic structure 3.

Embodiment 3

The first embodiment described above introduces a pressing stress in each periodic structure 3, in order to further introduce a pressing stress between two adjacent periodic structures 3, in addition to the thickness adjustment for adjacent periodic structures 3 as described in embodiment 2, the composition of compounds of adjacent periodic structures 3 may be adjusted. Specifically, in at least one periodic structure 3, the percentage $x_n$ of the number of atoms of Al in compound composition of the second periodic layer 32 of the nth periodic structure 3 in the epitaxial direction is larger than the percentage $x_{n+1}$ of the number of atoms of Al in compound composition of the second periodic layer 32 of the (n+1)th periodic structure 3, the percentage $y_n$ of the number of atoms of Al in compound composition of the first periodic layer 31 of the nth periodic structure 3 is greater than or equal to the percentage $y_{n+1}$ of the number of atoms of Al in compound composition of the first periodic layer 31 of the (n+1)th periodic structure 3. Thus, in the epitaxial direction, the percentage of the number of atoms of Al of the second periodic layer 32 in the periodic structure 3 which is farther away from the substrate, so that the average percentage of the number of atoms of Al in the entire epitaxial structure is gradually decreased in the epitaxial direction, thereby introducing a pressing stress to balance the tensile stress created during the cooling process.

In an embodiment of the present invention, there are five periodic structures 3 above the substrate 1:

A first periodic structure 3 is a periodic structure 3 with 10 periods, wherein $Al_{0.8}Ga_{0.2}N$ (thickness 5 nm) and $Al_{0.6}Ga_{0.4}N$ (thickness 10 nm) are sequentially stacked in one period;

A second periodic structure 3 is a periodic structure 3 with 20 periods, wherein $Al_{0.8}Ga_{0.2}N$ (thickness 5 nm) and $Al_{0.5}Ga_{0.5}N$ (thickness 15 nm) are sequentially stacked in one period;

A third periodic structure 3 is a periodic structure 3 with 30 periods, wherein $Al_{0.8}Ga_{0.2}N$ (thickness 5 nm) and $Al_{0.4}Ga_{0.6}N$ (thickness 15 nm) are sequentially stacked in one period;

A fourth periodic structure 3 is a periodic structure 3 with 40 periods, wherein $Al_{0.8}Ga_{0.2}N$ (thickness 5 nm) and $Al_{0.3}Ga_{0.7}N$ (thickness 20 nm) are sequentially stacked in one period;

A fifth periodic structure 3 is a periodic structure 3 with 45 periods, wherein $Al_{0.8}Ga_{0.2}N$ (thickness 5 nm) and $Al_{0.2}Ga_{0.5}N$ (thickness 25 nm) are sequentially stacked in one period.

In an embodiment of the present invention, there are five periodic structures 3 above the substrate 1:

A first periodic structure 3 is a periodic structure 3 with 10 periods, wherein $Al_{0.8}Ga_{0.2}N$ (thickness 5 nm) and $Al_{0.6}Ga_{0.4}N$ (thickness 10 nm) are sequentially stacked in one period;

A second periodic structure 3 is a periodic structure 3 with 20 periods, wherein $Al_{0.7}Ga_{0.2}N$ (thickness 5 nm) and $Al_{0.5}Ga_{0.5}N$ (thickness 15 nm) are sequentially stacked in one period;

A third periodic structure 3 is a periodic structure 3 with 30 periods, wherein $Al_{0.7}Ga_{0.2}N$ (thickness 5 nm) and $Al_{0.4}Ga_{0.6}N$ (thickness 15 nm) are sequentially stacked in one period;

A fourth periodic structure 3 is a periodic structure 3 with 40 periods, wherein $Al_{0.6}Ga_{0.2}N$ (thickness 5 nm) and $Al_{0.3}Ga_{0.7}N$ (thickness 20 nm) are sequentially stacked in one period;

A fifth periodic structure 3 is a periodic structure 3 with 45 periods, wherein $Al_{0.6}Ga_{0.2}N$ (thickness 5 nm) and $Al_{0.2}Ga_{0.5}N$ (thickness 25 nm) are sequentially stacked in one period.

In an embodiment of the present invention, there are five periodic structures 3 above the substrate 1:

A first periodic structure 3 is a periodic structure 3 with 10 periods, wherein AlN (thickness 5 nm) and $Al_{0.6}Ga_{0.4}N$ (thickness 10 nm) are sequentially stacked in one period;

A second periodic structure 3 is a periodic structure 3 with 20 periods, wherein AlN (thickness 5 nm) and $Al_{0.5}Ga_{0.5}N$ (thickness 15 nm) are sequentially stacked in one period;

A third periodic structure 3 is a periodic structure 3 with 30 periods, wherein AlN (thickness 5 nm) and $Al_{0.4}Ga_{0.6}N$ (thickness 15 nm) are sequentially stacked in one period;

A fourth periodic structure 3 is a periodic structure 3 with 40 periods, wherein AlN (thickness 5 nm) and $Al_{0.3}Ga_{0.7}N$ (thickness 20 nm) are sequentially stacked in one period;

A fifth periodic structure 3 is a periodic structure 3 with 45 periods, wherein Al (thickness 5 nm) and $Al_{0.2}Ga_{0.5}N$ (thickness 25 nm) are sequentially stacked in one period.

It should be understood that, although in the above-mentioned embodiments including five periodic structures 3, $III^1$ of the first periodic layer 31 of the five periodic structures 3 has a percentage of the number of atoms in compound composition as 0.8~1, and the percentage $y_n$ of the number of atoms of $III^1$ in compound composition of the first periodic layer 31 of the nth periodic structure 3 is 0~0.1 larger than the percentage $y_{n+1}$ of the number of atoms of $III^1$ in compound composition of the first periodic layer 31 of the (n+1)th periodic structure 3; the percentage of the number of atoms of $III^1$ in compound composition of the second periodic layer 32 of the five periodic structures 3 is 0.2~0.6, the percentage $x_n$ of the number of atoms of $III^1$ in compound composition of the second periodic layer 32 of the nth periodic structure is larger than the percentage $x_{n+1}$ of the number of atoms of $III^1$ in compound composition of the second periodic layer 32 of the (n+1)th periodic structure. However, the specific percentage of the number of atoms of $III^1$ in the first periodic layer 31 and the second periodic layer 32 of each periodic structure 3 can be adjusted according to the requirements of applications, which is not limited by the present invention.

Embodiment 4

An embodiment of the present invention provides a method of preparing a semiconductor structure. The method includes: preparing at least a periodic structure 3 above a substrate 1; wherein the materials of the periodic structures 3 are semiconductor compounds, each periodic structure 3 includes at least a period, each period includes a first periodic layer 31 and a second periodic layer 32 which are stacked sequentially along an epitaxial direction; wherein the first periodic layer 31 includes a first element and a second element, the second periodic layer 32 includes the first element and the second element; or, the first periodic layer 31 includes the first element, the second element and a third element, the second periodic layer 32 includes the first element, the second element and the third element; or, the first period layer 31 includes the first element and the third element, the second periodic layer 32 includes the first element, the second element and the third element; wherein in the same periodic structure 3, the percentage of the number of atoms of the first element in compound composition of the first periodic layer 31 is larger than the percentage of the number of atoms of the first element in compound composition of the second periodic layer 32, the thickness of the nth periodic structure 3 is smaller than the thickness of the (n+1)th periodic structure 3, wherein n is an integer greater than or equal to 1.

In an embodiment of the present invention, the number of periods of the nth periodic structure 3 is smaller than the number of periods of the (n+1)th periodic structure 3, so that the thickness of the nth periodic structure 3 is smaller than the thickness of the (n+1)th periodic structure 3.

In an embodiment of the present invention, the at least a periodic structure 3 may be prepared by using a metal vapor deposition, however, it should be understood that, the specific method of preparing the periodic structure 3 may be adjusted according to specific composition, the specific method for preparing the at least a periodic structure 3 is not limited by the present invention.

It should be understood that, the substrate 1 may be obtained directly, or by a preparing process, the skilled in the art may selectively obtain a suitable substrate 1 directly or obtain it by a preparing process, the specific method for obtaining the substrate 1 is not limited by the present invention.

As for the semiconductor structures prepared by above mentioned methods, at least a periodic structure 3 above the substrate forms an epitaxial structure, all the periodic layers in the periodic structure 3 use semiconductor compounds. Since the atomic number of the first element is smaller than the atomic number of the second element, and in the same periodic structure 3, the first element of the first periodic layer 31 has a percentage of the number of atoms in compound composition larger than the percentage of the number of atoms in compound composition of the first element of the second periodic layer 32, therefore in each period of the same periodic structure 3, the second periodic layer 32 located above will be subjected to a pressing stress, acting as protruding the center towards the periphery, from the first periodic layer 31 beneath, the pressing stress can effectively balance out a tensile stress, acting as concaving the periphery towards the center in the entire epitaxial structure during a cooling process, such that the entire epitaxial structure will not easily get cracked and warped.

Meanwhile, since the dislocation density of a position in the epitaxial structure closer to the substrate is larger, and the position with large dislocation density easily cause the release of the pressing stress, and the released pressing stress will not take effect to balance out the tensile stress, a periodic structure 3 with a lower dislocation density may therefore have a larger thickness by setting the thickness of the nth periodic structure 3 along the epitaxial direction smaller than the thickness of the (n+1)th periodic structure 3, such that the pressing stress introduced in a periodic structure 3 far away from the substrate can better balance out a tensile stress, thereby effectively balance the release of the pressing stress in the entire epitaxial structure, ensuring an equilibrium effect of the pressing stress against the tensile stress in the entire epitaxial structure.

It should be understood that, for better understanding the technical solutions, qualifiers "first", "second" and "third" are merely used to differentiate varieties of III group elements or V group elements, and to differentiate varieties of periodic layers; meanwhile, symbols "$III^1$", "$III^2$", and "$V^1$" and characters "n", "x", and "y" are merely used to better explain the technical solutions of the present invention, all the above qualifiers, symbols and characters shall not be used to limit the protection scope of the present invention.

The above are only preferable embodiments of the invention which are not intended to limit the scope of protection of the invention. All modifications, equivalent substitutions, and improvements made within the spirit and principles of the present invention shall be included within the protection scope of the present invention.

The invention claimed is:

1. A semiconductor structure, characterized in that, the semiconductor structure includes:

a substrate;

at least a periodic structure disposed above said substrate;

wherein the materials of said periodic structures are semiconductor compounds, each said periodic structure includes at least one period, each said period includes a first periodic layer and a second periodic layer which are sequentially stacked in an epitaxial direction;

wherein said first periodic layer includes a first element and a second element, said second periodic layer includes said first element and said second element; or, said first periodic layer includes said first element, said second element and a third element, said second periodic layer includes said first element, said second element, and said third element; or, said first periodic layer includes said first element and said third element, said second periodic layer includes said first element, said second element, and said third element; wherein the atomic number of said first element is smaller than the atomic number of said second element;

wherein, in the same periodic structure, said first element of said first periodic layer has a percentage of the number of atoms in compound composition greater than a percentage of the number of atoms in compound composition of said first element of said second periodic layer, the thickness of the nth periodic structure is smaller than the thickness of the (n+1)th periodic structure, wherein n is an integer greater than or equal to 1.

2. The semiconductor structure according to claim 1, characterized in that, the number of periods of said nth periodic structure is less than the number of periods of said (n+1)th periodic structure.

3. The semiconductor structure according to claim 1, characterized in that, the materials of said first periodic layer and said second periodic layer are both IV-IV group binary compounds, said first element and said second element are two types of IV group elements, respectively.

4. The semiconductor structure according to claim 3, characterized in that, said first element and said second element are Si and Ge, respectively.

5. The semiconductor structure according to claim 1, characterized in that, the materials of said first periodic layer and said second periodic layer are both IV-IV group compounds, said first element, said second element, and said third element are three types of IV group elements, respectively; or the materials of said first periodic layer and said second periodic layer are both III-V group compounds, said first element and said second element are two types of III group elements respectively, and said third element is a V group element; or the materials of said first periodic layer and said second periodic layer are both II-VI group compounds, said first element and said second element are two types of II group elements respectively, and said third element is a VI group element.

6. The semiconductor structure according to claim 5, characterized in that, the materials of said first periodic layer and said second periodic layer are both IV-IV group compounds, said first element, said second element, and said third element are Si, Ge and Sn, respectively; or the materials of said first periodic layer and said second periodic layer are both III-V group compounds, said first element and said second element are Al and Ga, respectively, and said third element is N; or the materials of said first periodic layer and said second periodic layer are both II-VI group compounds, said first element and said second element are Zn and Cd, respectively, and said third element is Se.

7. The semiconductor structure of claim 1, characterized in that, in the same periodic structure, the thickness of said second periodic layer is greater than the thickness of said first periodic layer.

8. The semiconductor structure according to claim 2, characterized in that, in said at least one periodic structure, the thickness of said first periodic layer of said nth periodic structure in the epitaxial direction is greater than the thickness of said first periodic layer of said (n+1)th periodic structure, the thickness of said second periodic layer of said nth periodic structure is equal to the thickness of said second periodic layer of said (n+1)th periodic structure; or in said at least one periodic structure, the thickness of said first periodic layer of said nth periodic structure in the epitaxial direction is equal to the thickness of said first periodic layer of said (n+1)th periodic structure, and the thickness of said second periodic layer of said nth periodic structure is smaller than the thickness of said second periodic layer of said (n+1)th periodic structure; or in said at least one periodic structure, the thickness of said first periodic layer of said nth periodic structure in the epitaxial direction is greater than the thickness of said first periodic layer of said (n+1)th periodic structure, and the thickness of said second periodic layer of said nth periodic structure is less than the thickness of said second periodic layer of said (n+1)th periodic structure.

9. The semiconductor structure according to claim 1, characterized in that, in said at least one periodic structure, said first element of said second periodic layer of said nth periodic structure in the epitaxial direction has a percentage $x_n$ of the number of atoms in compound composition greater than the percentage $x_{n+1}$ of the number of atoms in compound composition of said first element of said second periodic layer of said (n+1)th periodic structure, and said first element of said first periodic layer of said nth periodic structure has a percentage $y_n$ of the number of atoms in compound composition greater than or equal to the percentage $y_{n+1}$ of the number of atoms in compound composition of said first element of said first periodic layer of said (n+1)th periodic structure.

10. The semiconductor structure according to claim 1, characterized in that, further including: a nucleation layer disposed between said substrate and the first one of said periodic structures.

11. The semiconductor structure according to claim 10, characterized in that, said nucleation layer includes one or more of AlN, AlGaN.

12. The semiconductor structure according to claim 1, characterized in that, further including: a component active layer disposed over said at least one periodic structure.

13. The semiconductor structure according to claim 12, characterized in that, said component active layer includes one or more of GaN, AlGaN, AlInGaN.

14. The semiconductor structure according to claim 1, characterized in that, said substrate includes one or more of Si, SiC, GaN, $Al_2O_3$.

15. A method of preparing a semiconductor structure, characterized in that, including:

preparing at least one periodic structure over a substrate; wherein the materials of said periodic structures are semiconductor compounds, each said periodic structure includes at least one period, each said period includes a first periodic layer and a second periodic layer which are sequentially stacked in an epitaxial direction; wherein said first periodic layer includes a first element and a second element, said second periodic layer includes said first element and said second element; or, said first periodic layer includes said first element, said second element and a third element, said second periodic layer includes said first element, said second element and said third element; or, the first periodic layer includes said first element and said third element, said second periodic layer includes said first element, said second element and said third element; wherein the atomic number of said first element is smaller than the atomic number of said second element; wherein, in the same periodic structure, said first element of said first periodic layer has a percentage of the number of atoms in compound composition greater than the percentage of the number of atoms in compound composition of said first element of said second periodic layer, the thickness of the nth periodic structure is smaller than the thickness of the (n+1)th periodic structure, wherein n is an integer greater than or equal to 1.

* * * * *